United States Patent [19]

Arakawa

[11] Patent Number: 4,878,203

[45] Date of Patent: Oct. 31, 1989

[54] SEMICONDUCTOR NON-VOLATILE MEMORY WITH CUT-OFF CIRCUIT WHEN LEAKAGE OCCURS

[75] Inventor: Hideki Arakawa, Yokohama, Japan

[73] Assignee: Fujitsu Limited, Kawasaki, Japan

[21] Appl. No.: 247,130

[22] Filed: Sep. 19, 1988

[30] Foreign Application Priority Data

Sep. 19, 1987 [JP] Japan ................................ 62-233651

[51] Int. Cl.$^4$ ................................................ G11C 7/00
[52] U.S. Cl. ................................ 365/226; 365/185; 365/195; 365/189.01; 365/230.03
[58] Field of Search .................... 365/185, 195, 189.01, 365/208, 230.03, 226

[56] References Cited

U.S. PATENT DOCUMENTS

| | | | |
|---|---|---|---|
| 4,597,062 | 6/1986 | Asano et al. | 365/185 |
| 4,601,020 | 7/1986 | Arakawa et al. | 365/226 |
| 4,630,238 | 12/1986 | Arakawa | 365/185 |
| 4,673,829 | 6/1987 | Gupta | 365/230 |
| 4,703,456 | 10/1987 | Arakawa | 365/185 |

*Primary Examiner*—James W. Moffitt

*Attorney, Agent, or Firm*—Armstrong, Nikaido, Marmelstein, Kubvocik & Murray

[57] ABSTRACT

A semiconductor non-volatile memory device includes: a memory cell array having a plurality of memory cells, each including a non-volatile memory cell portion; a high voltage generating circuit for generating a high voltage required for storing data; a plurality of high voltage wirings, each being allocated to each of a corresponding plurality of blocks divided into units of a predetermined number of cells in the memory cell array and being commonly connected to all of the cells in a corresponding block; and a plurality of high voltage feeding circuits, each feeding the high voltage from the high voltage generating circuit to the cells in the corresponding block, and when a leak occurs in any one of the cells in the corresponding block, stopping the feed of the high voltage.

By feeding the high voltage separately to each of the blocks divided into units of a predetermined number of cells, a highly reliable store operation can be realized, and if an ECC circuit is mounted, the ECC relief effect can be increased.

11 Claims, 9 Drawing Sheets

SEMICONDUCTOR NON-VOLATILE MEMORY WITH CUT-OFF CIRCUIT WHEN LEAKAGE OCCURS

BACKGROUND OF THE INVENTION

1. Field of the Invention

The present invention relates to a semiconductor non-volatile memory device and, more particularly, to a memory device in which a non-volatile memory cell using a floating gate circuit element, for example, an electrically erasable and programmable read only memory (EEPROM) cell, is provided at each intersection of a plurality of word lines and a plurality of bit lines.

As one form of the semiconductor non-volatile memory device, a non-volatile random access memory (NVRAM) device is known in which a volatile memory cell, for example, a static RAM (SRAM) cell, and an EEPROM cell are combined on a one-to-one basis on a chip and integrated. Since such an NVRAM device possesses both a function of an SRAM, i.e., a high speed read/write operation, and a feature of an EEPROM, i.e., non-volatility, it has been utilized in fields in which, even when a power source is OFF, data is not lost but stored, and when the power source is ON, the data can be freely erased and programmed. For example, the NVRAM device is utilized in electronic musical instruments, IC cards, facsimile apparatuses, telephone sets, or the like.

2. Description of the Related Art

In the conventional NVRAM device, the store operation is carried out by utilizing a tunnel effect occurring within an oxidation layer formed between a floating gate and a diffused region in the EEPROM cell. In the store operation, a strongly boosted voltage is employed and a portion thereof is applied across a tunnel capacitor representing an equivalent capacitance of the oxidation layer, with the result that positive or negative charges remain on the floating gate. For example, the positive charges correspond to "1" data and the negative charges to "0". Namely, to reliably carry out the store operation for each memory cell, a predetermined high voltage must be fed to every cell.

In the known non-volatile memory device, a power supply line for feeding or transmitting the high voltage is commonly connected to all of the cells, and therefore, where a leak occurs in any one of the cells due to the destruction or deterioration of the tunnel capacitor or the like, currents flow through the non-functional cell, so that the high level of the voltage is lowered as a whole. As a result, a sufficiently high voltage required for storing data cannot be obtained even in a functional cell where a cell leak does not occur, and this is not preferable from the viewpoint of the reliability of the store operation.

Also, it is known that, when the store and recall operations are repeated, a memory cell may become non-functional due to fatigue of the oxidation layer or the like, and in this case, a wrong data is read out from the non-functional cell. Accordingly, a device has been proposed in which a circuit for automatically correcting the wrong data, hereinafter referred to as an error check and correct (ECC) circuit, is mounted on a chip. In this case, the device can function normally only when a one bit cell becomes non-functional.

In the device where a power supply line of the high voltage for the store operation is commonly connected to all of the cells, however, there is a possibility in that all of the functional cells will become non-functional due to only one non-functional cell. In this case, even if the ECC circuit is provided, a perfect correction of all wrong data cannot be obtained.

SUMMARY OF THE INVENTION

An object of the present invention is to provide a semiconductor non-volatile memory device in which the store operation can be carried out with a high reliability.

Another object of the present invention is to increase the effect of an ECC relief where an ECC circuit is mounted on a chip together with the above non-volatile memory.

The above objects are attained by providing a semiconductor non-volatile memory device comprising: a memory cell array having a memory cell including a non-volatile memory cell portion, the memory cell being provided at each intersection of a plurality of word lines and a plurality of bit lines; a high voltage generating circuit being supplied with an external power supply voltage and generating a high voltage required for storing data in the non-volatile memory cell portion; a plurality of high voltage wirings, each being allocated to each of a corresponding plurality of blocks divided into units of a predetermined number of cells in the memory cell array and being commonly connected to all of the cells in a corresponding block; and a plurality of high voltage feeding circuits operatively connected between the plurality of high voltage wirings and the high voltage generating circuit, each of the high voltage feeding circuits feeding the high voltage from the high voltage generating circuit to the cells in the corresponding block, and when a leak occurs in any one of the cells in the corresponding block, stopping the feed of the high voltage to the corresponding block.

BRIEF DESCRIPTION OF THE DRAWINGS

Other objects and features of the present invention will be described hereinafter in detail by way of the preferred embodiments with reference to the accompanying drawings, in which.

DESCRIPTION OF THE PREFERRED EMBODIMENTS

For a better understanding of the preferred embodiments, the problems of the prior art will now be explained with reference to FIG. 1.

Note, in the following description, the term "transistor" indicates an enhancement type N-channel metal oxide semiconductor (NMOS) field effect transistor, unless otherwise stated.

Figure 1:
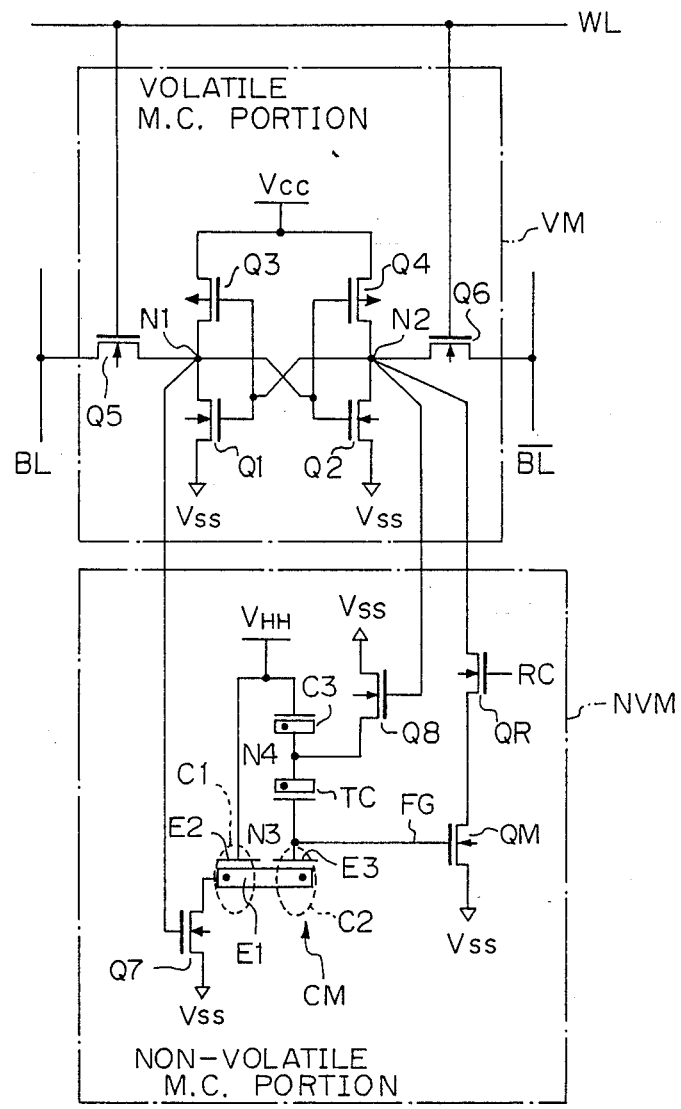
FIG. 1 is a circuit diagram illustrating a typical constitution of a memory cell employed in the NVRAM device.

FIG. 1 shows a typical constitution of a memory cell employed in the NVRAM device. The memory cell includes a volatile memory cell portion VM and a non-volatile memory cell portion NVM, which are combined on a one-to-one basis on a chip and integrated.

The volatile memory cell portion VM includes a flip-flop type arrangement having transistors Q1, Q2 and P-channel MOS transistors Q3, Q4 as in the conventional SRAM device. A read/write operation of data is carried out between nodes N1, N2 and the corresponding bit lines BL, $\overline{BL}$ via transfer gate transistors Q5, Q6, respectively.

The non-volatile memory cell portion NVM includes transistors Q7, Q8, a transistor QR turning ON in response to a control signal RC output during a recall operation, a memory transistor QM in which a gate FG is brought to a floating state, a capacitor module CM, a capacitor C3, and a tunnel capacitor TC as a floating gate circuit element. In the capacitor module CM, capacitors C1 and C2 are formed between an electrode E1 and electrodes E2 and E3, respectively. The electrode E1 corresponds to a diffused region constituting a source/drain (S/D) in the semiconductor substrate, and the electrodes E2 and E3 correspond to gates.

Note, in the description below, the term "tunnel capacitor" indicates a capacitor causing a tunnel effect when a predetermined voltage is applied across the electrodes thereof.

In the NVRAM cell shown in FIG. 1, when the power source is ON, the volatile memory cell portion VM carries out a read/write operation in the same way as a conventional SRAM. The data in the volatile memory cell portion VM is stored in the non-volatile memory cell portion NVM before the power source is turned OFF, and utilizing the non-volatile characteristic, the data is held therein while the power source is OFF. When the power source is turned ON, the data in the non-volatile memory cell portion NVM is recalled to the volatile memory cell portion VM and the conventional read/write operation is carried out.

For example, in the store operation, assuming that the node N1 is at "L" level and the node N2 is at "H" level, when a power supply voltage $V_{HH}$ is raised to 25 to 30 V, the transistor Q7 is made OFF and the transistor Q8 is made ON. Accordingly, the node N4 is lowered to "L" level, i.e., substantially a potential of $V_{SS}$, and the power supply voltage $V_{HH}$ is applied to a series circuit of the capacitor C1, C2 and TC. As a result, electrons are injected from the node N4 via the node N3 to the gate FG due to the tunnel effect, and accordingly, negative charges are accumulated in the floating gate circuit of the memory transistor QM. Likewise, where the node N1 is at "H" level and the node N2 is at "L" level, positive charges are accumulated in the gate FG.

On the other hand, in the recall operation, the potentials at bit lines BL and $\overline{BL}$ are first settled or preset to the predetermined levels and a potential at a word line WL is raised to "H" level. Accordingly, the transistors Q5 and Q6 are turned ON and the nodes N1 and N2 are settled to predetermined levels in accordance with the potentials at the bit lines BL and $\overline{BL}$. Assuming that the node N1 is "L" level and the node N2 is "H" level, the recall signal RC is raised to "H" level. If negative charges are accumulated in the gate FG, the transistor QM is turned OFF and a source of the transistor QR is electrically separated from a lower power supply line $V_{SS}$, and accordingly, a potential at the node N2 is maintained at the "H" level. Conversely, a potential at the node N1 is maintained at the "L" level, and as a result, the flip-flop circuit is preset. Likewise, if positive charges are accumulated in the gate FG, the transistors QM and QR are turned ON, and accordingly, the node N2 is pulled down to "L" level and the node N1 is pulled up to "H" level.

In the above NVRAM, the store operation is carried out by raising the normal power supply voltage $V_{CC}$ (5 V) to a higher voltage $V_{HH}$ (25 to 30 V) by a boosting circuit (not shown) within the chip, applying the high voltage $V_{HH}$ to the capacitor circuit including the tunnel capacitor TC, and activating positive or negative charges in the floating gate FG, before the power source is turned OFF. In this case, the power supply line for feeding the high voltage $V_{HH}$ is commonly provided for all of the memory cells. Namely, the high voltage $V_{HH}$ is simultaneously applied to each of the cells, and accordingly, the store operation is carried out at the same time for each cell. Also, the driving ability of the boosting circuit for generating the high voltage $V_{HH}$ within the chip is limited.

Therefore, where a leak occurs in any one of the cells due to the deterioration of the capacitor, tunnel capacitor, or the like, a problem arises in that currents flow through the non-functional cell, so that the level of the high voltage $V_{HH}$ is lowered as a whole. Consequently, even in a functional cell where a leak does not occur, it becomes impossible to maintain a high voltage at least necessary for storing data, so that a disadvantage occurs in that the store operation, i.e., the write-in operation for the EEPROM cell, cannot be perfectly carried out. Namely, where one of the cells becomes non-functional, the remaining functional cells cannot function normally. This means that the NVRAM device cannot operate normally as a memory, which is not preferable from the viewpoint of the reliability of the store operation.

In the NVRAM device, the store and recall operations inevitably are repeatedly carried out, and in this regard, a possible number of times of repetition of the store operation, i.e., re-writing of data for the non-volatile memory cell portion, is defined from the viewpoint of the manufacturer's guarantee of the quality of the device. When the re-writing is frequently repeated, a memory cell may become non-functional due to a crystallinity of semiconductor constituting the memory cell, a deterioration in a tunnel insulation film and the like, particles of dust, an unsatisfactory patterning, or the like. Especially, most of the majority of causes of a non-functional state of a memory cell originate in the deterioration or destruction of the tunnel insulation film. As is generally known, when the re-writing of data for the non-volatile memory cell portion is carried out, a greater part of the high voltage is applied across the tunnel insulation film. Accordingly, fatigue or deterioration of the tunnel insulation film easily occurs due to the increase in the number of times of re-writing, and as a result, a problem arises in that "positive" or "negative" charges accumulated in the floating gate as memory data, leak through the tunnel insulation film.

To solve the above problem, in 1984 Seeq Tech. Co. proposed a device in which an error check and correct (ECC) circuit together with a memory is mounted on a chip. In the ECC circuit, when information data is written into cells, check data is generated based on a combination of certain bits of the information data. Next, when the information data written to the cells is read out via a sense amplifying (S/A) circuit, the check and correction of the information data is carried out based on a combination of certain bits of the check data and information data. Namely, where a certain bit of the information data is erroneous, the logical level of the wrong bit is inverted to the right level, and thus, due to the ECC circuit, even if a cell of one bit among one word becomes non-functional, a correct output signal can be read out.

Therefore, in the non-volatile memory device in which the ECC circuit is mounted on a chip together with the memory, the ECC circuit can operate normally, i.e., a perfect relief of data (ECC relief), when a leak occurs in a cell of one bit. As previously described, however, all of the functional cells may become non-functional due to the deterioration of only one cell. In this case, even if the ECC circuit is mounted on the chip, the perfect relief of all of the wrong data cannot be obtained.

As explained above, in the prior art non-volatile memory device including an NVRAM in which a power supply line of the high voltage ($V_{HH}$) employed in the store operation is commonly connected to all of the memory cells, possible problems have arisen in that the write-in (programming or storing) operation for the non-volatile memory cells cannot be realized with a high reliability where a cell leak occurs, and even if the ECC circuit for relief of erroneous data is mounted, this circuit cannot function properly when a cell leak occurs.

Figure 2:
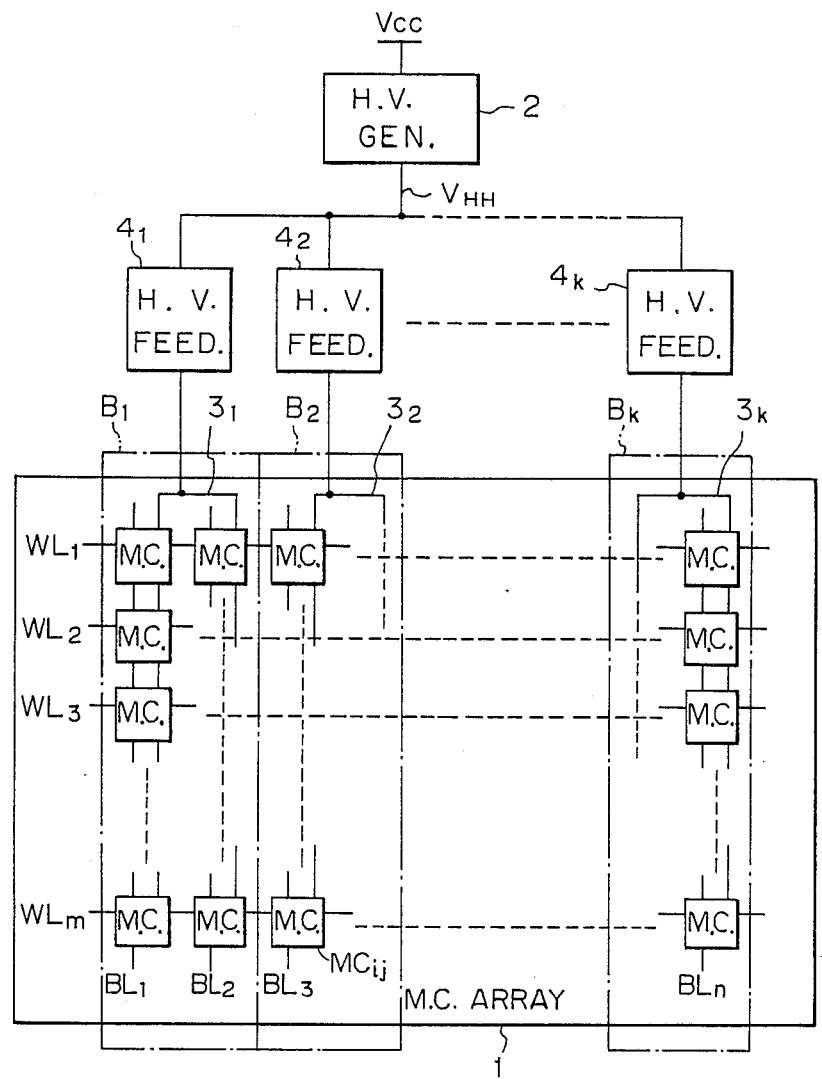
FIG. 2 is a block diagram for explaining a principle of the semiconductor non-volatile memory device according to the present invention.

FIG. 2 illustrates a fundamental constitution of the semiconductor non-volatile memory device according to the present invention.

In FIG. 2, reference 1 denotes a memory cell array having a plurality of memory cells $MC_{ij}$ ($i=1-m$, $j=1-n$), each of which is provided at each intersection of a plurality of word lines $WL_1-WL_m$ and a plurality of bit lines $BL_1-BL_n$, and includes at least a non-volatile memory cell portion. Reference 2 denotes a high voltage generating circuit, which is supplied with an external power supply voltage $V_{CC}$ and generates a high voltage $V_{HH}$ required for storing data in the non-volatile memory cell portion. References $3_1$ to $3_k$ denote a plurality of high voltage wirings, each of which is allocated to each of a corresponding plurality of blocks $B_1$ to $B_k$ divided into units of a predetermined number of cells in the memory cell array, and commonly connected to all of the cells belonging to a corresponding block. References $4_1$ to $4_k$ denote a plurality of high voltage feeding circuits, each of which is operatively connected between the corresponding high voltage wiring and the high voltage generating circuit. Each of the circuits $4_1$ to $4_k$ feeds the high voltage $V_{HH}$ from the high voltage generating circuit 2 to the cells belonging to the corresponding block and, when a leak occurs in any one of the cells belonging to the corresponding block, stops the feed of the high voltage $V_{HH}$ to the corresponding block.

According to the above constitution, the plurality of high voltage wiring is disposed separately with each unit of the predetermined number of cells. Consequently, even if a leak occurs in any one of the memory cells belonging to any one of the blocks, no influence therefrom is exerted on the memory cells belonging to other blocks. Also, the supply of the high voltage $V_{HH}$ to the block including a cell where a leak occurs is stopped, but is maintained to the other blocks. Accordingly, the store operation in these other blocks can be perfectly carried out.

Next, a preferred embodiment of the present invention will be described in detail with reference to FIGS. 3 and 8a to 8e.

Figure 3:
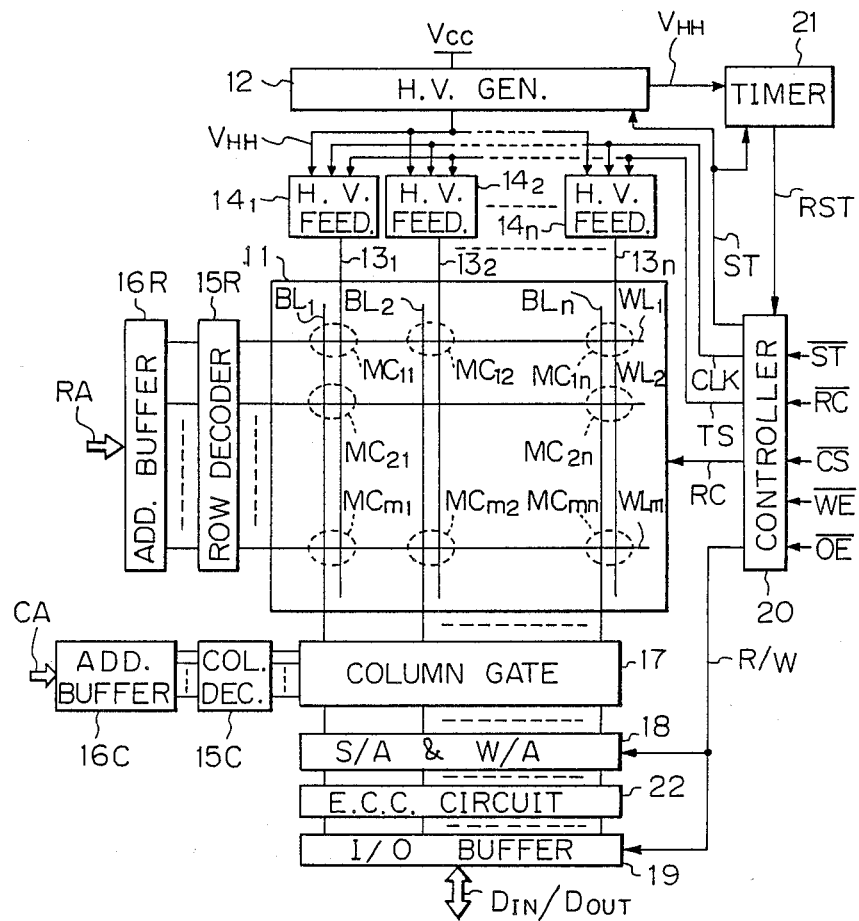
FIG. 3 is a block diagram illustrating a constitution of the NVRAM device as an embodiment of the present invention.

Referring to FIG. 3, which illustrates a constitution of the NVRAM device as an embodiment of the present invention, a memory cell array 11 includes a plurality of memory cells $MC_{ij}$ ($i=1-m$, $j=1-n$), each of which is disposed at each intersection of word lines $WL_1-WL_m$ and bit lines $BL_1-BL_n$. The memory cell $MC_{ij}$ has the same constitution as in FIG. 1, i.e., is composed of the flip-flop type SRAM cell arrangement employed in the conventional SRAM device, and the EEPROM cell provided for the SRAM cell on a one-to-one basis. Reference 12 denotes a circuit for generating a high voltage $V_{HH}$ (approximately 25-30 V) required for storing data in the SRAM cell to the EEPROM cell. The high voltage generating circuit 12 boosts a normal power supply voltage $V_{CC}$ (5 V) to a higher voltage $V_{HH}$ in response to a store signal ST from a controller 20.

A plurality of high voltage wirings $13_1$ to $13_n$ are disposed, each wiring being allocated to each of a corresponding plurality of blocks divided into units of a predetermined number of cells (in the illustrated example, a block of cells is divided into units of one bit line). Each high voltage wiring $13_1$ to $13_n$ is electrically separated from the other, but is commonly connected to all of the cells belonging to the corresponding block. For example, the high voltage wiring $13_1$ is commonly connected to all of the EEPROM cells in the memory cells $MC_{11}$, $MC_{21}$, ---, $MC_{m1}$.

A plurality of high voltage feeding circuits $14_1$ to $14_n$ are disposed between the high voltage generating circuit 12 and the high voltage wirings $13_1$ to $13_n$. Each of the circuits feeds the high voltage $V_{HH}$ from the high voltage generating circuit 12 to the cells belonging to the corresponding block, and when a leak occurs in any one of the cells in the corresponding block, stops the feed of the high voltage $V_{HH}$ to the corresponding block. For example, when a leak occurs in the memory cell $MC_{m2}$, the high voltage feeding circuit $14_2$ stops the feed of the high voltage $V_{HH}$ to the high voltage wiring $13_2$. A concrete constitution of the high voltage feeding circuits $14_1$ to $14_n$ and the operation thereof will be described later.

References 15R, 15C, --- ---, 22 denote constituent elements which are normally provided in the NVRAM device. Namely, a row decoder 15R cooperates with an address buffer 16R and selects one of the word lines $WL_1-WL_m$ based on address information in a row address signal RA. Also, a column decoder 15C cooperates with an address buffer 16C and a column gate 17 and selects one of the bit lines $BL_1-BL_n$ based on address information in a column address signal CA. Reference 18 denotes a sense amplifying (S/A) and write amplifying (W/A) circuit, which amplifies a signal level of data read from a memory cell in the read operation, and buffers and amplifies data to be written in a memory cell in the write operation. Reference 22 denotes an ECC circuit which automatically corrects a data error in the read operation. Reference 19 denotes an input/output (I/O) buffer, which buffers the read-out data or write-in data ($D_{IN}/D_{OUT}$) between the ECC circuit 22 and the external of the chip.

The controller 20 controls the memory cell array 11 and the peripheral circuit, and has the following concrete functions: first, to bring the whole device to an enable state in response to a low-active chip select signal $\overline{CS}$; second, to bring the S/A & W/A circuit 18 and I/O buffer 19 to a write mode in response to a low-active write enable signal $\overline{WE}$; third, to bring the S/A & W/A circuit 18 and I/O buffer 19 to a read mode in response to a low-active output enable signal $\overline{OE}$; fourth, to output a test signal TS for detecting a cell leak, clocks CLK, and the store signal ST in response to a low-active store signal $\overline{ST}$; and fifth, to feed a recall signal RC to each of the cells in response to a low-active recall signal $\overline{RC}$. Reference 21 denotes a timer, which responds to the store signal ST from the controller 20 and the high voltage $V_{HH}$ from the high voltage generating circuit 12, and feeds a reset signal RST to the controller 20 after a lapse of a predetermined time. Upon receipt of this signal RST, the controller 20 restores the level of the test signal TS to the original level thereof.

In the constitution shown in FIG. 3, even if a leak occurs in any one of the memory cells connected to one high voltage wiring, no influence is exerted on other high voltage wiring, because each high voltage wiring $13_1$ to $13_n$ is electrically separated from the other. Accordingly, for the memory cells connected to the high voltage wirings except for the wiring to which a nonfunctional cell is connected, the high voltage $V_{HH}$ required for storing data can be maintained without a decrease thereof, and as a result, the store operation can be carried out with a high reliability to the functional memory cells.

Figure 4:
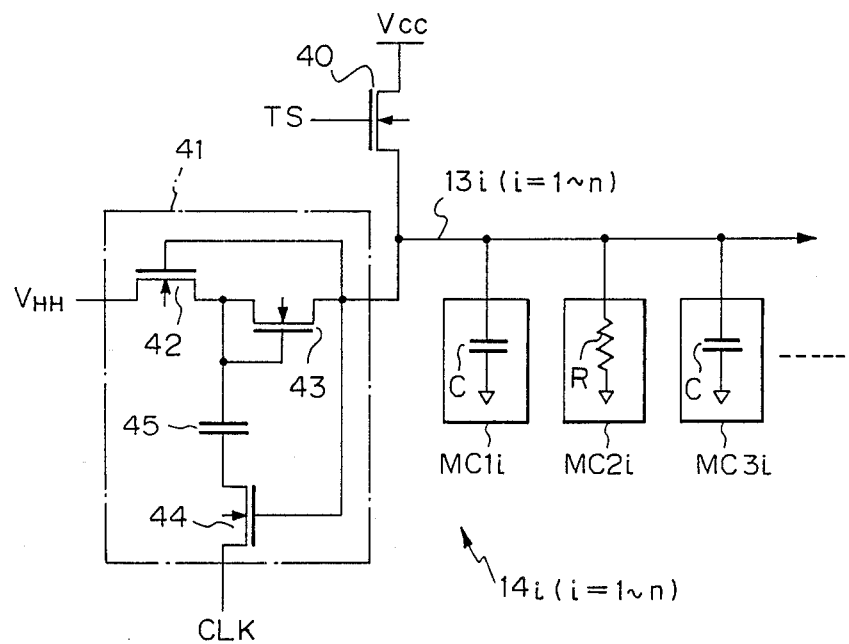
FIG. 4 is a circuit diagram illustrating a constitution of the high voltage feeding circuit shown in FIG. 3.

Next, a circuit constitution of the high voltage feeding circuit $14_i$ (i=1−n) shown in FIG. 3 will be described with reference to FIG. 4.

The illustrated circuit includes a transistor 40 connected between the power supply line $V_{CC}$ (5 V) and an end of a corresponding high voltage wiring $13_i$ (i=1−n) and turned ON in response to the test signal TS, and a charge-pumping circuit 41 connected between the end of the corresponding high voltage wiring $13_i$ and the high voltage generating circuit 12 and transmitting the high voltage $V_{HH}$ from the high voltage generating circuit to the high voltage wiring in response to the clocks CLK. The charge-pumping circuit 41 is constituted by three transistors 42–44 and a capacitor 45. Note, references $MC_{1i}$, $MC_{2i}$, ------, $MC_{mi}$ indicate memory cells. In this case, when a leak in a cell does not occur, each of the cells is equivalently represented by a capacitor C as shown in the cells $MC_{1i}$ and $MC_{3i}$, due to a cut-off of a direct-current signal thereby. Conversely, when a leak occurs in a cell, each of the cells is equivalently represented by a resistor R as shown in the cell $MC_{2i}$, as this resistor can pass the direct-current signal. The operation of the circuit shown in FIG. 4 will be explained later.

Next, a circuit constitution of the part generating the leak test signal TS, which is included in the controller 20 shown in FIG. 3, and the operation thereof, will be explained with reference to FIGS. 5 and 6a to 6g.

Figure 5:
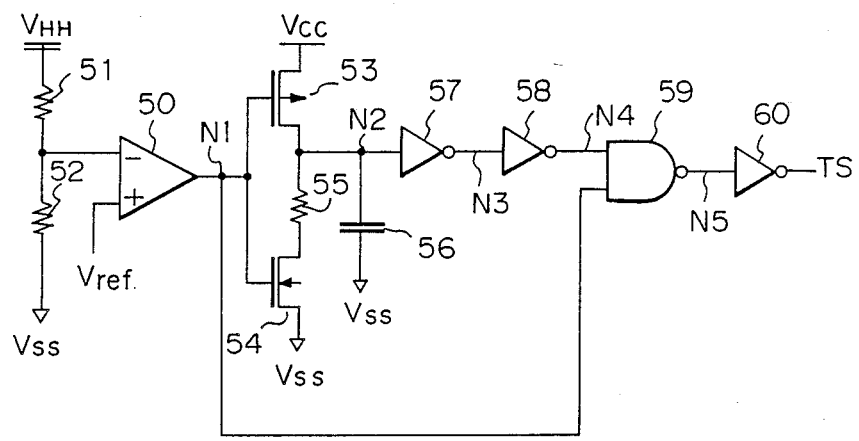
FIG. 5 is a circuit diagram illustrating a constitution of the part generating a leak test signal in the controller shown in FIG. 3.
Figure 6:
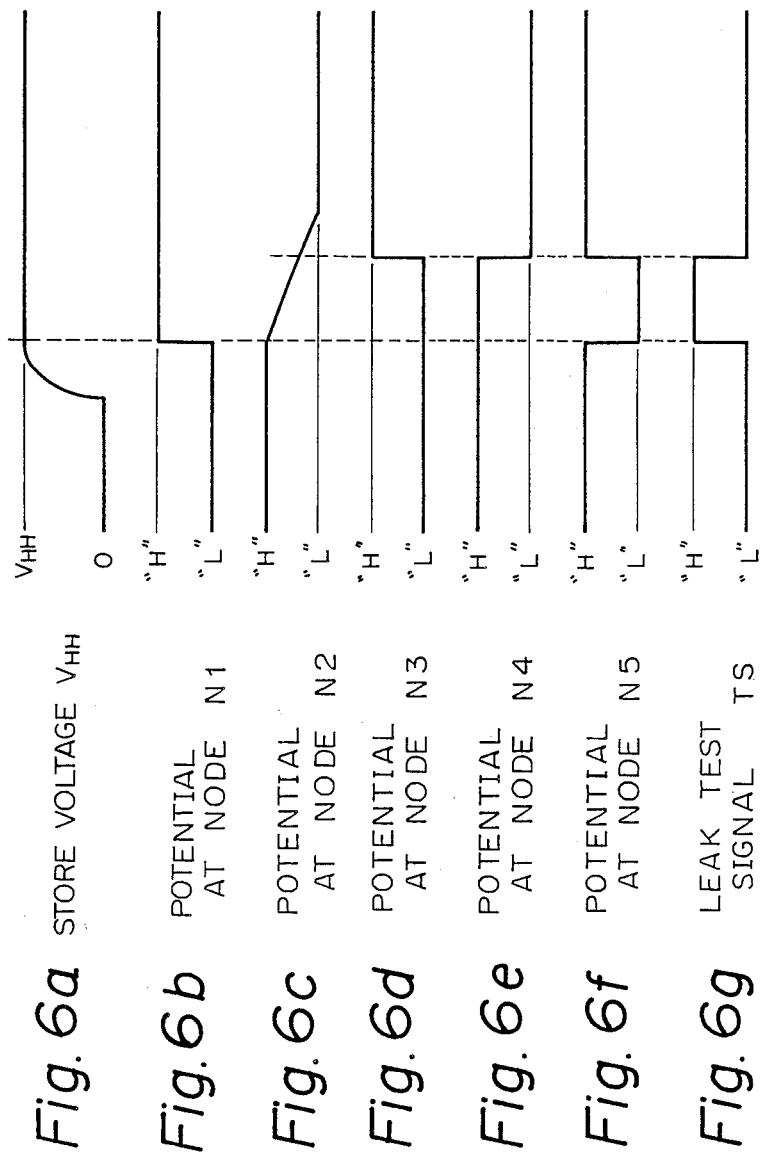
FIGS. 6a to 6g are waveform diagrams for explaining the operation of the circuit shown in FIG. 5.

Referring to FIG. 5, resistors 51 and 52 are connected in series between the high voltage power supply line $V_{HH}$ and a lower power supply line $V_{SS}$ (0 V). The connection point of the resistors 51 and 52 is connected to an inverting input end of an operational amplifier 50, which receives a reference voltage $V_{ref}$ at a non-inverting input end thereof. An output end (node N1) of the amplifier 50 is connected to each gate of a P-channel transistor 53 and an N-channel transistor 54 and one input end of an NAND gate 59. A source of the transistor 53 is connected to the power supply line $V_{CC}$ and a drain thereof is connected via a resistor 55 to a drain of the transistor 54 having a source connected to the power supply line $V_{SS}$. Also, the drain (node N2) of the transistor 53 is connected to an input end of an inverter 57 and one end of a capacitor 56 having another end connected to the power supply line $V_{SS}$. An output end (node N3) of the inverter 57 is connected via an inverter 58 to another input end of the NAND gate 59, which is defined as a node N4. An output end (node N5) of the NAND gate 59 is connected to an inverter 60, which outputs the leak test signal TS.

Referring to FIGS. 6a to 6g and FIG. 5, when the store voltage $V_{HH}$ is at zero level, a potential at node N1 is at "L" level, and the transistor 53 is turned ON. Since a potential at node N2 is raised to a level of $V_{CC}$ ("H" level), the capacitor 56 is charged with a voltage of $V_{CC}$. In this state, potentials at nodes N3, N4 and N5 are at "L" level, "H" level, and "H" level, respectively, and accordingly, the leak test signal TS is at "L" level.

When the store voltage $V_{HH}$ is raised to a level of $V_{HH}$ (25–30 V), the potential at node N1 is raised to "H" level, so that the transistor 54 is turned ON and the transistor 53 is made OFF. At the same time, the potential at node N5 is lowered to "L" level, and the leak test signal TS is raised to "H" level. The charges accumulated in the capacitor 56 are discharged via the resistor 55 and the turned-ON transistor 54 to the line $V_{SS}$. When the potential at node N2 falls below a threshold level of the inverter 57, the potential at node N3 is raised to "H" level. Since the potential at node N4 is lowered to "L" level, the potential at node N5 is raised to "H" level, and accordingly, the leak test signal TS is lowered to "L" level. Namely, the pulse width of the leak test signal TS is defined by a time constant of the resistor 55 and capacitor 56.

Figure 7:
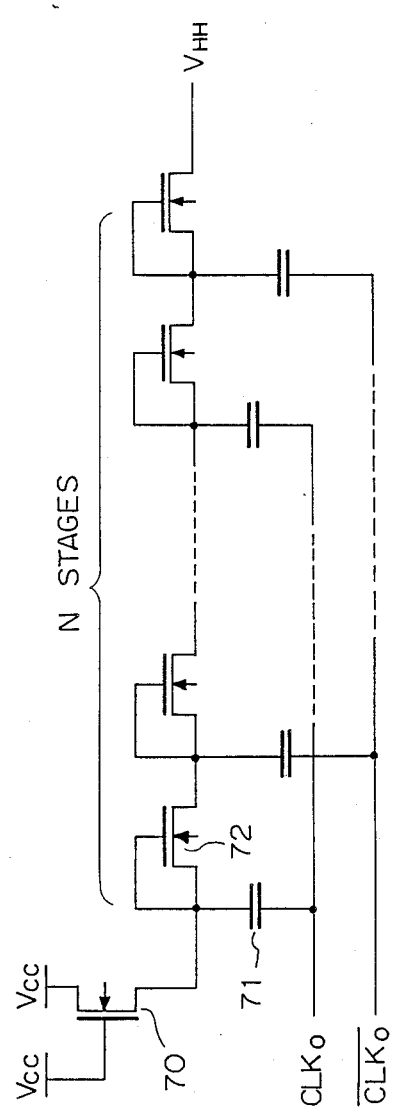
FIG. 7 is a circuit diagram illustrating a constitution of the high voltage generating circuit shown in FIG. 3.

Next, a circuit constitution of the high voltage generating circuit 12 shown in FIG. 3, and the operation thereof, will be explained with reference to FIG. 7.

The illustrated circuit includes a transistor 70 having a gate connected to the power supply line $V_{CC}$, and a boosting circuit which receives the voltage $V_{CC}$ via the transistor 70, and in response to a pair of internal clock signals $CLK_0$ and $\overline{CLK_0}$, generates the high voltage $V_{HH}$. The boosting circuit has a Cockcroft-type constitution including a CR circuit consisting of a transistor 72 functioning as a resistor and a capacitor 71 in N stages (10 to 20 stages). Each of the CR circuits is supplied with the clock signal $CLK_0$ or $\overline{CLK_0}$ at every other stage. Note, the clock signals $CLK_0$ and $\overline{CLK_0}$ are generated in response to the store signal ST fed from the controller 20. Thus, the boosting circuit outputs a boosted voltage $V_{HH}$ in response to the normal power supply voltage $V_{CC}$ and the clock signals $CLK_0$ and $\overline{CLK_0}$.

Next, the operation of the high voltage feeding circuit $14_i$ shown in FIG. 4 will be described with reference to FIGS. 8a to 8e.

Initially, when the store signal $\overline{ST}$ is lowered to "L" level and then raised to "H" level, the store voltage $V_{HH}$ is raised to "H" level and output from the high voltage generating circuit 12. When the store voltage $V_{HH}$ rises to the potential of $V_{HH}$ (25–30 V), the leak test signal TS is raised to "H" level by the circuit shown in FIG. 5, and as a result, the transistor 40 is turned ON so that the potential on the high voltage wiring $13_i$ is pulled up to the level of $V_{CC}$ (see FIG. 8d). After a lapse of the constant time defined by the time constant of the resistor 55 and capacitor 56 shown in FIG. 5, the test signal TS is lowered to the original "L" level thereof.

Assuming that a leak in a cell has not occurred, then the following operation is carried out.

Since the high voltage wiring $13_i$ is electrically in a floating state, the potential thereof is maintained 5 at the level of $V_{CC}$ (5 V), and accordingly, the transistor 44 is turned ON and the clock CLK is transmitted via the transistor 44 and capacitor 45 to a gate of the transistor 43 and a source/drain of the transistor 42. As a result, the transistors 42 and 43 are turned ON, so that the high voltage $V_{HH}$ (25–30 V) fed from the high voltage generating circuit 12 is transmitted to the high voltage wiring $13_i$ by the operation of the charge-pumping circuit 41.

Conversely, assuming that a leak in a cell has occurred, then the following operation is carried out.

Figure 8:
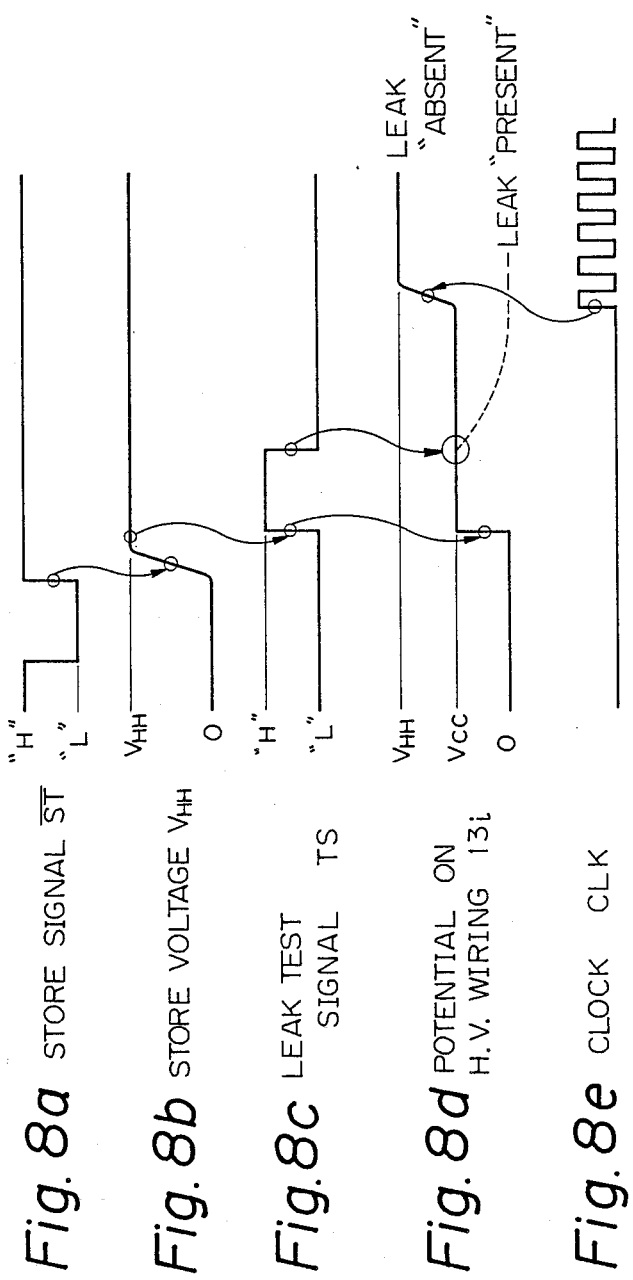
FIGS. 8a to 8e are waveform diagrams for explaining the operation of the circuit shown in FIG. 4.

Since the charges on the high voltage wiring $13_i$ are discharged through the equivalent resistor R to the ground, the potential on the wiring $13_i$ is gradually lowered as shown in FIG. 8d by a broken line, and accordingly, the transistor 44 is brought to the cut-off state, so that the clock CLK is not transmitted to the charge-pumping circuit 41. Namely, the high voltage generating circuit 12 and the high voltage wiring $13_i$ are electrically separated, and consequently, the supply of the high voltage $V_{HH}$ to the high voltage wiring is stopped.

As explained above in detail, according to the embodiment illustrated in FIG. 3, the high voltage $V_{HH}$ necessary for a store operation is fed separately to each of n blocks divided into units of m cells in the memory cell array 11, and when a leak occurs in any one of the cells in the corresponding block, the supply of the high voltage $V_{HH}$ to the corresponding block is stopped. Therefore, the store operation to the remaining blocks can be realized with a high reliability.

Also, since the memory cell array 11 is divided into n blocks at units of one bit line, it is possible to increase the ECC relief effect for a cell which is non-functional due to a destruction of the capacitor thereof, deterioration in the tunnel insulation film thereof, or the like. This is as for the following reasons: In general, the probability that a cell will becomes non-functional in one bit line is very small, and even if a leak in cell occurs in one bit line, only one cell at most will become non-functional. Nevertheless, taking all of the bit lines into consideration, the number of non-functional cells is not always one, and thus, according to the prior art constitution in which the high voltage wiring is commonly connected to all of the cells, the ECC circuit cannot function properly, as previously described.

Figure 9:
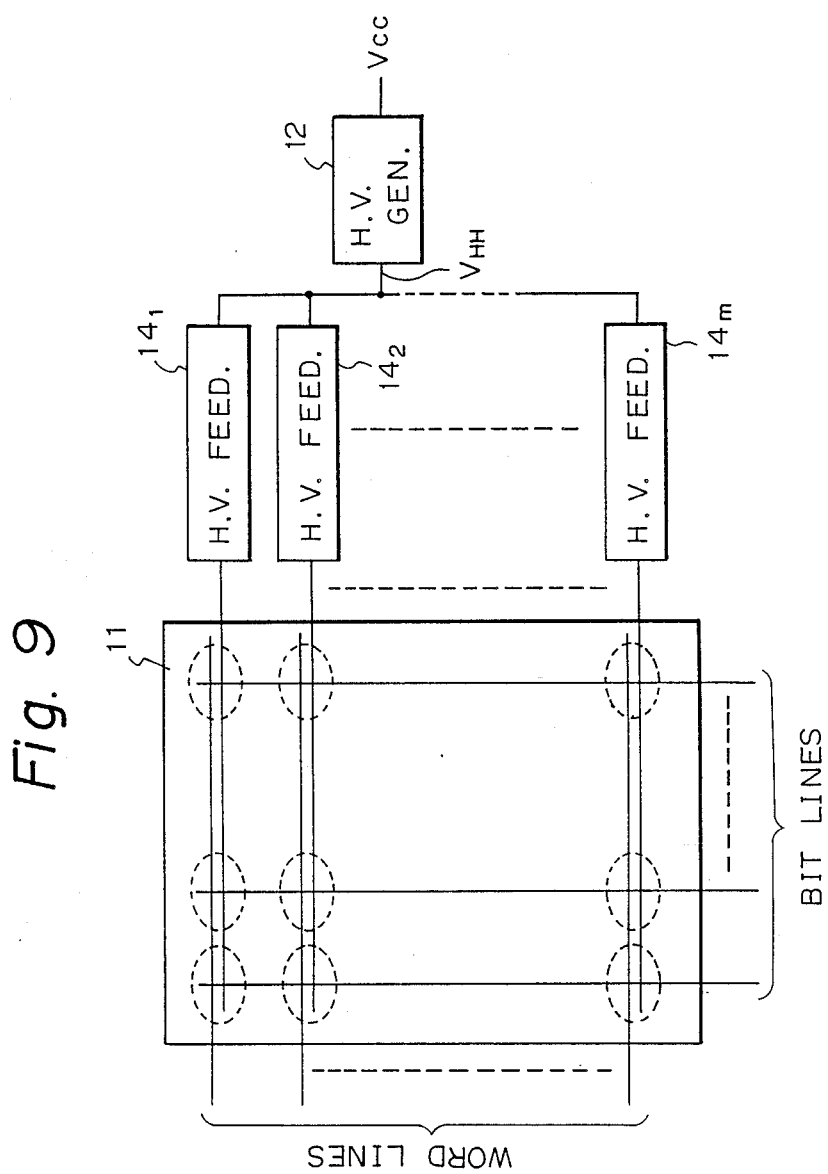
FIG. 9 is a block diagram schematically illustrating a modification of the embodiment shown in FIG. 3.

Although, in the embodiment shown in FIG. 3, each of a plurality of high voltage feeding circuits is allocated to each of the blocks divided into units of one bit line, this is not limited thereto. For example, as shown in FIG. 9 as a modification, each of a plurality of high voltage feeding circuits can be allocated to each block divided into units of one word line.

Figure 10:
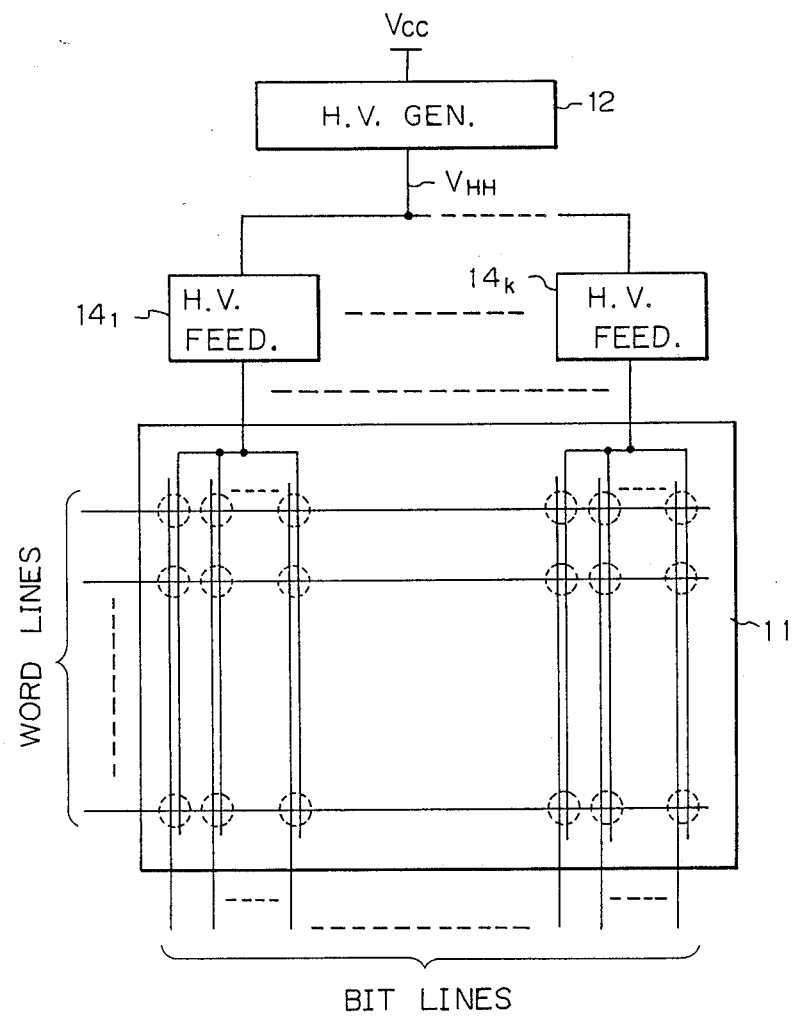
FIG. 10 is a block diagram schematically illustrating another modification of the embodiment shown in FIG. 3.

Also, as shown in FIG. 10 as another modification, each of a plurality of high voltage feeding circuits can be allocated to a predetermined number of bit lines divided into units of an I/O block. Furthermore, each of the high voltage feeding circuits can be allocated to the above bit lines of a unit of the I/O block, plus a predetermined number of bit lines for the ECC circuit.

Although the present invention has been disclosed and described by way of one embodiment and two modifications, it is apparent to those skilled in the art that other embodiments and modifications of the present invention are possible without departing from the spirit or essential features thereof.

I claim:

1. A semiconductor non-volatile memory device comprising:

a memory cell array having a memory cell including a non-volatile memory cell portion, said memory cell being provided at each intersection of a plurality of word lines and a plurality of bit lines;

a high voltage generating circuit being supplied with an external power supply voltage and generating a high voltage required for storing data in said non-volatile memory cell portion;

a plurality of high voltage wirings, each being allocated to each of a corresponding plurality of blocks divided into units of a predetermined number of cells in said memory cell array and being commonly connected to all of said cells in a corresponding block; and a plurality of high voltage feeding circuits operatively connected between said plurality of high voltage wirings and said high voltage generating circuit, each of said high voltage feeding circuits feeding said high voltage from said high voltage generating circuit to said cells in said corresponding block, and when a leak occurs in any one of said cells in said corresponding block, stopping the feed of said high voltage to said corresponding block.

2. A device as set forth in claim 1, wherein each of said plurality of high voltage feeding circuits comprises a transistor connected between an end of a corresponding high voltage wiring and a power supply line of a predetermined level and turned ON in response to a control signal having a predetermined logical level, and a charge-pumping circuit connected between said end of said corresponding high voltage wiring and said high voltage generating circuit and transmitting said high voltage from said high voltage generating circuit to said high voltage wiring in response to a chain of clocks.

3. A device as set forth in claim 2, wherein said charge-pumping circuit stops transmitting said high voltage to the corresponding high voltage wiring when a potential on said wiring falls due to said leak in cell after said control signal of said predetermined logical level is applied to said transistor for a predetermined time.

4. A device as set forth in claim 2, further comprising a controller generating said control signal and said chain of clocks, said control signal being generated in response to an external store signal and said chain of clocks being generated at a predetermined time after a generation of said control signal.

5. A device as set forth in claim 4, wherein said predetermined time is selected to a time in which a potential on the corresponding high voltage wiring is settled to a certain level due to said leak in cell.

6. A device as set forth in claim 1, wherein each of said plurality of blocks includes one of said plurality of word lines.

7. A device as set forth in claim 1, wherein each of said plurality of blocks includes one of said plurality of bit lines.

8. A device as set forth in claim 1, wherein each of said plurality of blocks includes two or more word lines divided into a predetermined number of units in said plurality of word lines.

9. A device as set forth in claim 1, wherein each of said plurality of blocks includes two or more bit lines divided into a predetermined number of units in said plurality of bit lines.

10. A device as set forth in claim 1, wherein each of said plurality of blocks includes two or more bit lines divided into a predetermined number of units in said plurality of bit lines, and another predetermined number of bit lines employed for correcting an error in a logical level of data read out from a selected memory cell.

11. A device as set forth in claim 10, further comprising an error correcting circuit provided for both said predetermined number of bit lines and said another predetermined number of bit lines.

* * * * *